United States Patent [19]
McClure

[11] Patent Number: 5,986,914
[45] Date of Patent: *Nov. 16, 1999

[54] ACTIVE HIERARCHICAL BITLINE MEMORY ARCHITECTURE

[75] Inventor: David Charles McClure, Carrollton, Tex.

[73] Assignee: STMicroelectronics, Inc., Carrollton, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/475,421

[22] Filed: Jun. 7, 1995

Related U.S. Application Data

[63] Continuation of application No. 08/040,666, Mar. 31, 1993, abandoned.

[51] Int. Cl.⁶ ...................................................... G11C 7/00

[52] U.S. Cl. .......................... 365/63; 365/190; 365/203; 365/207

[58] Field of Search ............................. 365/63, 190, 203, 365/207

[56] References Cited

U.S. PATENT DOCUMENTS

| | | | |
|---|---|---|---|
| 4,208,730 | 6/1980 | Dingwald et al. | 365/203 X |
| 4,558,435 | 12/1985 | Hsieh | 365/203 |
| 4,926,382 | 5/1990 | Sakui et al. | 365/149 X |
| 5,117,389 | 5/1992 | Yiu | 365/10 X |
| 5,245,570 | 9/1993 | Fazio et al. | 365/230.03 X |
| 5,258,957 | 11/1993 | Seta et al. | 365/207 |
| 5,353,255 | 10/1994 | Komure | 365/149 X |

*Primary Examiner*—Do Hyun Yoo
*Attorney, Agent, or Firm*—Theodore E. Galanthay; Lisa K. Jorgenson; Renee M. Larson

[57] ABSTRACT

In a high density memory, such as a SRAM, DRAM, EPROM or EEPROM, a hierarchical bitline configuration is utilized such that a number of local bitlines are connected to a master bitline through interface circuitry which connects a local bitline to the master bitline. Local select signals, when set to the appropriate voltage level, couple a local bitline to the master bitline. In addition to reducing the local bitline capacitance that must be driven by memory cells, the hierarchical configuration may provide layout area savings as well. Interface circuitry is modified to provide voltage and signal gain and/or provide isolation between the local bitlines and the master bitlines, thereby reducing the amount of capacitance which must be driven by memory cells and the amount of time required to develop differential signals on the master bitlines.

61 Claims, 7 Drawing Sheets

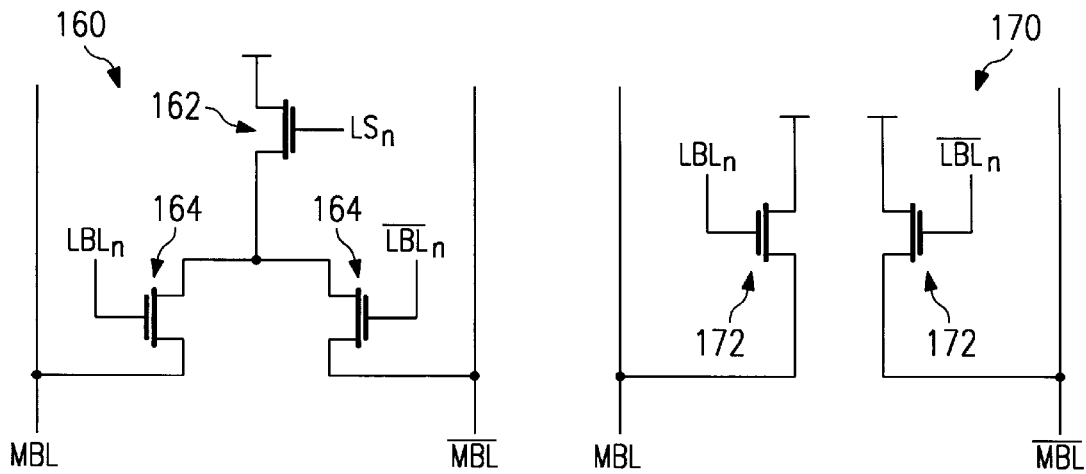
FIG. 7                    FIG. 8
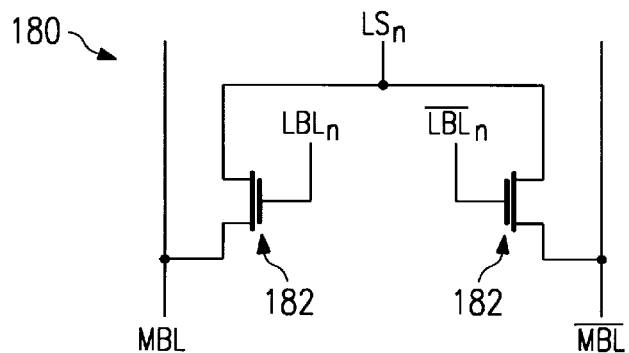
FIG. 9
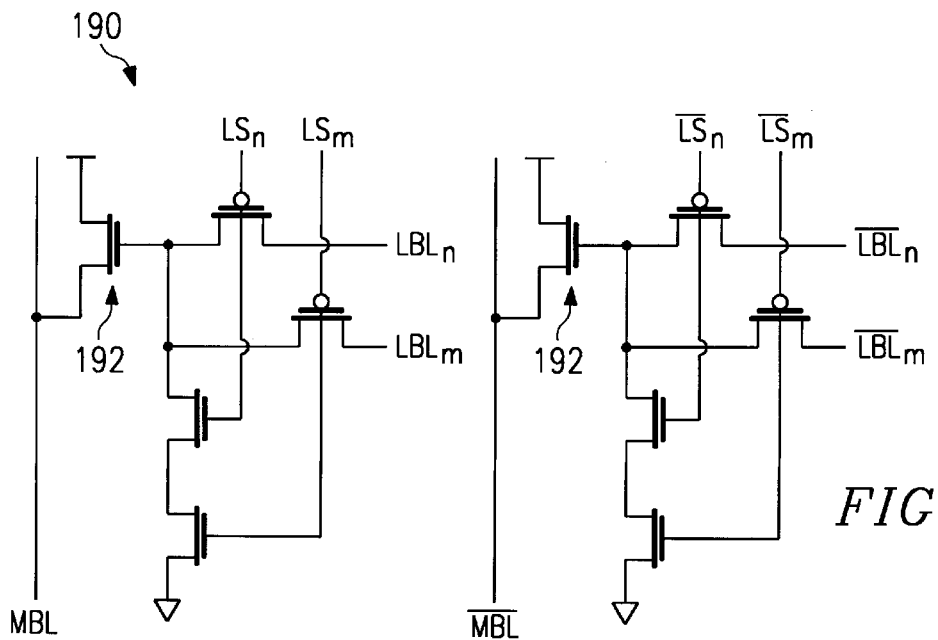
FIG. 10

ACTIVE HIERARCHICAL BITLINE MEMORY ARCHITECTURE

This is a Continuation of application Ser. No. 08/040,666, filed Mar. 31, 1993 now abandoned.

CROSS REFERENCE TO RELATED APPLICATIONS

The subject matter of the present application is related to copending United States application, titled "Passive Hierarchical Bitline Memory Architecture", filed with the Application hereof on Mar. 31, 1993, Attorney Docket Number 93-C-08, issuing as U.S. Pat. No. 5,457,647 on Oct. 10, 1995, assigned to the assignee hereof, and which is herein incorporated by reference.

BACKGROUND OF THE INVENTION

1. Field of the Invention

The present invention relates generally to integrated circuits, and more specifically to interface circuitry within hierarchical bitline memory architecture which provides gain and/or isolation characteristics.

2. Description of the Prior Art

In recent years, high density memories such as SRAMs, DRAMs, EPROMs, and EEPROMs have dramatically increased the level of bitline capacitance which must be driven by memory cells in the memory array. As high speed memories have increased in density, efforts have been made to carefully partition the memory array to reduce the burden on the memory cell for driving large bitline capacitances. For example, memory arrays have gone to four times the number of columns as rows to reduce bitline capacitance. In addition, the rows are sometimes bisected by the sensing and column decode circuitry to further reduce bitline capacitance. In spite of the advances made in careful partitioning of the memory array, bitline capacitance can still be prohibitively large, having an adverse affect on device speed and signal integrity. As a result, better methods for reducing the bitline capacitance as seen by memory cells while using minimum layout area are needed and appropriate.

SUMMARY OF THE INVENTION

In a high density memory, such as a SRAM, DRAM, EPROM or EEPROM, a hierarchical bitline configuration is utilized such that a number of local bitlines are connected to a master bitline through interface circuitry which connects a local bitline to the master bitline. Local select signals, when set to the appropriate voltage level, couple a local bitline to the master bitline. In addition to reducing the local bitline capacitance that must be driven by memory cells, the hierarchical configuration may provide layout area savings as well.

Interface circuitry is modified to provide voltage and signal gain and/or provide isolation between the local bitlines and the master bitlines, thereby reducing the amount of capacitance which must be driven by memory cells and the amount of time required to develop differential signals on the master bitlines.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 4–17 are schematic diagrams illustrating alternate preferred embodiments of interface circuitry, and master bitline loading devices, necessary for performing a read, according to the present invention.

DESCRIPTION OF THE PREFERRED EMBODIMENT

Figure 1:
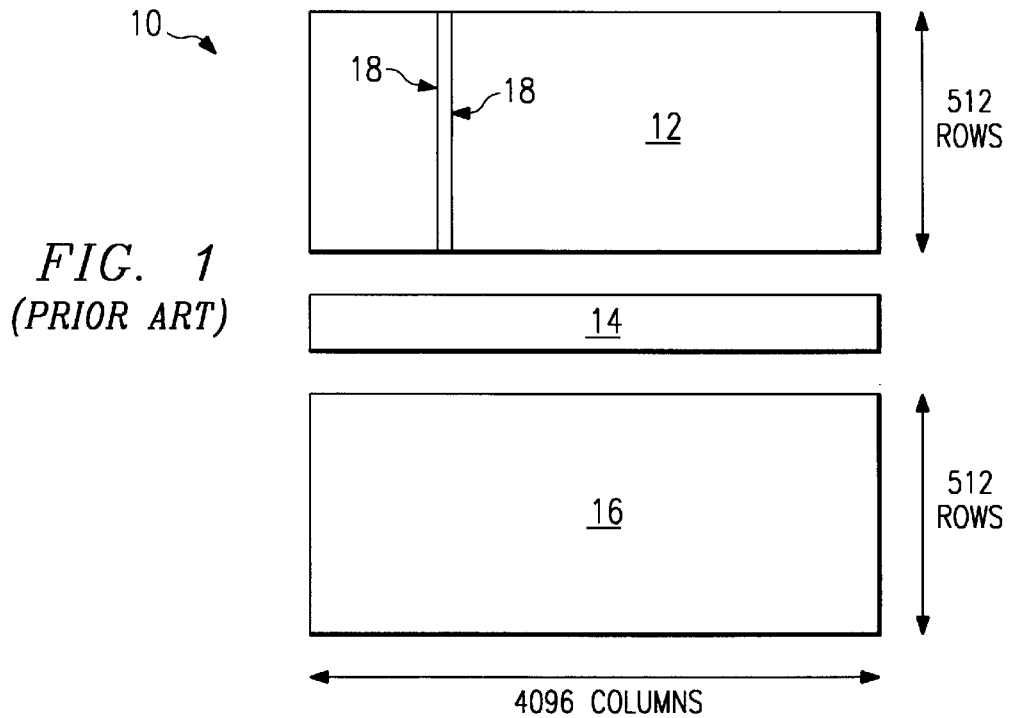
FIG. 1 is a block diagram of a partitioned memory array according to the prior art.

Referring to FIG. 1, a block diagram of a partitioned memory array 10 according to the prior art is shown. As high speed memories, such as SRAMs, have become larger in density, there has been considerable emphasis placed on careful partitioning of the memory array to reduce the capacitance of bitline pairs, such as might be introduced by bitline pair 18, which must be driven by memory cells in the array.

As a result of this emphasis, memory array partitioning has increased in size and complexity. For example, memory arrays have increased the number of columns to four times the number of rows in an effort to reduce bitline capacitance. This is shown in FIG. 1 where there are 4096 columns to 1024 rows, a configuration which is representative of a 4 Megabit SRAM. Also illustrated is the bisection of rows by column decoding and sense amp circuitry 14 into two row sections 12 and 16, each having 512 rows. While this methodology does yield a decrease in bitline capacitance, it may not be sufficient for memories of very high density and/or high speed.

Figure 2:
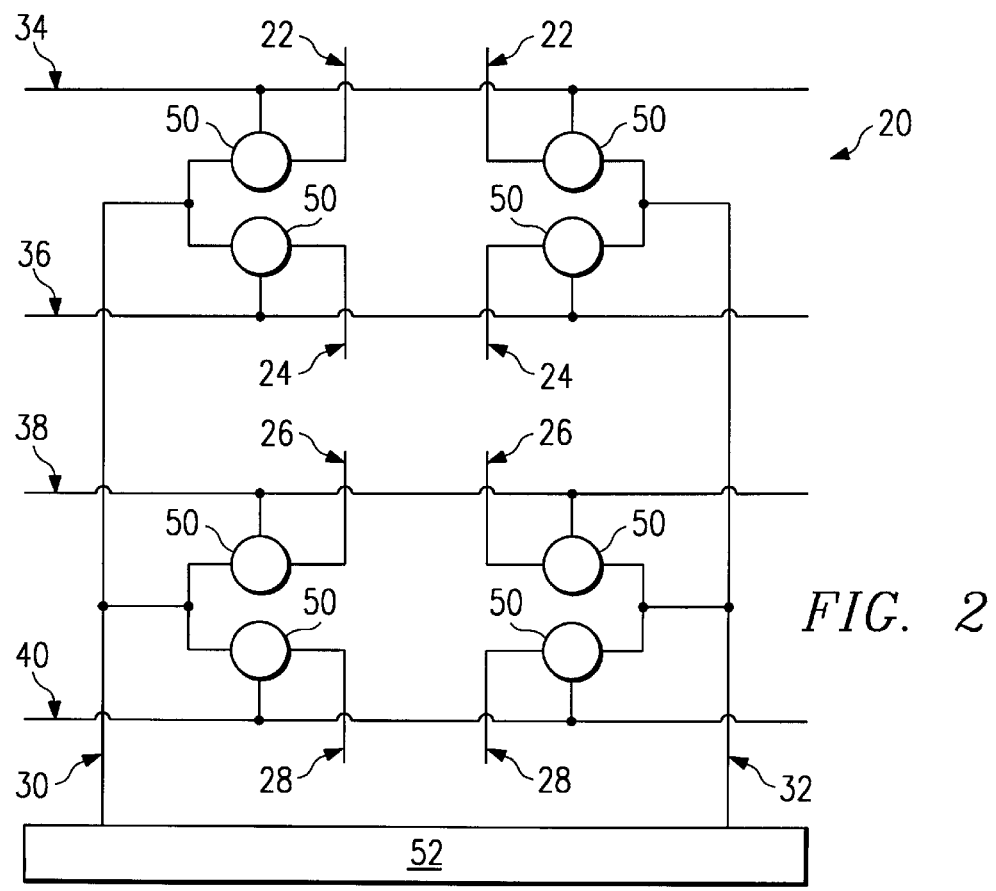
FIG. 2 is a schematic diagram of a portion of a partitioned memory array according to the present invention.

Referring now to FIG. 2, a schematic diagram of a portion of a partitioned memory array 20 according to the present invention is shown. A hierarchical bitline configuration is employed, whereby local bitline pairs, such as 22, 24, 26, and 28 are connected to master bitline 30 and its complement, $\overline{\text{master bitline}}$ 32. Local bitline pairs are composed of two bitlines which are the complement of each other, as is well understood in the art. Likewise, master bitline 30 and $\overline{\text{master bitline}}$ 32 together form a master bitline pair.

Continuing with the 4 Megabit SRAM example, the 512 cell bitline of FIG. 1 is divided into four local bitline pairs 22, 24, 26, and 28 of 128 cells each. Each local bitline pair is separated from the other three local bitline pairs by interface circuitry 50 that connects a local bitline to master bitline 30 and $\overline{\text{master bitline}}$ 32. Local select signals 34, 36, 38, and 40 each couple an associated local bitline to master bitline 30 and $\overline{\text{masterbitline}}$ 32. For example, local select signal 34 couples its local bitline 22 to master bitline 30 and 32.

As discussed above, a long bitline pair has been divided into four local bitline pairs; however, it is valid to break the bitline into any number of local bitline pair segments. The tradeoff to be considered is that while a larger number of segments would yield less capacitance and thus faster signal development, this would be done at the expense of additional layout area being consumed by an increased number of interface circuitry 50 and increased loading on the master bitline. However, if traditional architecture having an equal number of rows as columns is used and column decoding and sense amp circuitry 14 as shown in FIG. 1 is placed at the edge of the memory array, then utilization of hierarchical architecture having master and local bitlines can result in layout area savings. This technique will utilize a smaller die than the prior art memory array of FIG. 1 and will result in equal or better performance as measured by decreased bitline capacitance. The use of master bitlines allows for a smaller memory die even if the performance is the same.

For high density memories, three metal layers may be utilized to achieve layout savings and to render local and master bitlines and wordline control. For example, it may be desirable to place master wordlines and sub-master wordlines in the first metal layer M1, local bitlines in M2, and master bitlines in M3. Master bitlines can be placed on top of local bitlines or at an offset from local bitlines such that layout area is conserved and local bitline capacitance is reduced. A master bitline in M3 could be placed directly on top of its associated local bitline which resides in M2. The master bitline capacitance is primarily bussing capacitance of the highest level conductor, in this case M3, with virtually no junction capacitance except at interface circuitry 50. Therefore, if the master bitline 30 and $\overline{\text{master bitline}}$ 32 are placed over the local bitline, up to one-third of the bus would couple to itself; it is not necessary for the master bitline pair to be placed over the first local bitline pair 22 if sensing circuitry and master bitline control 52 is situated at the bottom as shown in FIG. 2. The bitline capacitance that a memory cell must drive is reduced by as much as one-fourth the typical capacitance of the prior-art.

Due to the relative newness of a third metal layer, pitch control may not be as readily available for the third metal layer as for the first and second metal layers. Since master and sub-master wordlines typically do not require as much pitch control as master and local bitlines, an alternate utilization of metal layers is to place local bitlines in M1, master bitlines in M2 and master and sub-master wordlines in M3. This arrangement of metal layers may make the manufacturing process easier to control.

Local bitlines which are not selected by their respective local select signals should not be allowed to float at an undetermined voltage level for an indefinite period of time. A bitline pull-up transistor may be placed on each local bitline, but this solution requires a good amount of layout area, area which would be desirable to conserve as much as possible. As an alternative, a high value resistor may be formed in polysilicon 1, 2, or 3 layers, or in the active diffusion region to serve as a maintaining current source at the chosen voltage level, typically $V_{CC}$ or $V_{CC}$-$V_T$. High value resistors in the local bitlines may greatly reduce the layout area required for high density devices and prevent local bitlines from floating at undetermined voltage levels. Similarly, the master bitline may also have its own load device for facilitating read and write operations, whereby writing is performed using conventional methods and sensing may be accomplished using conventional voltage or current sensing techniques.

Figure 3:
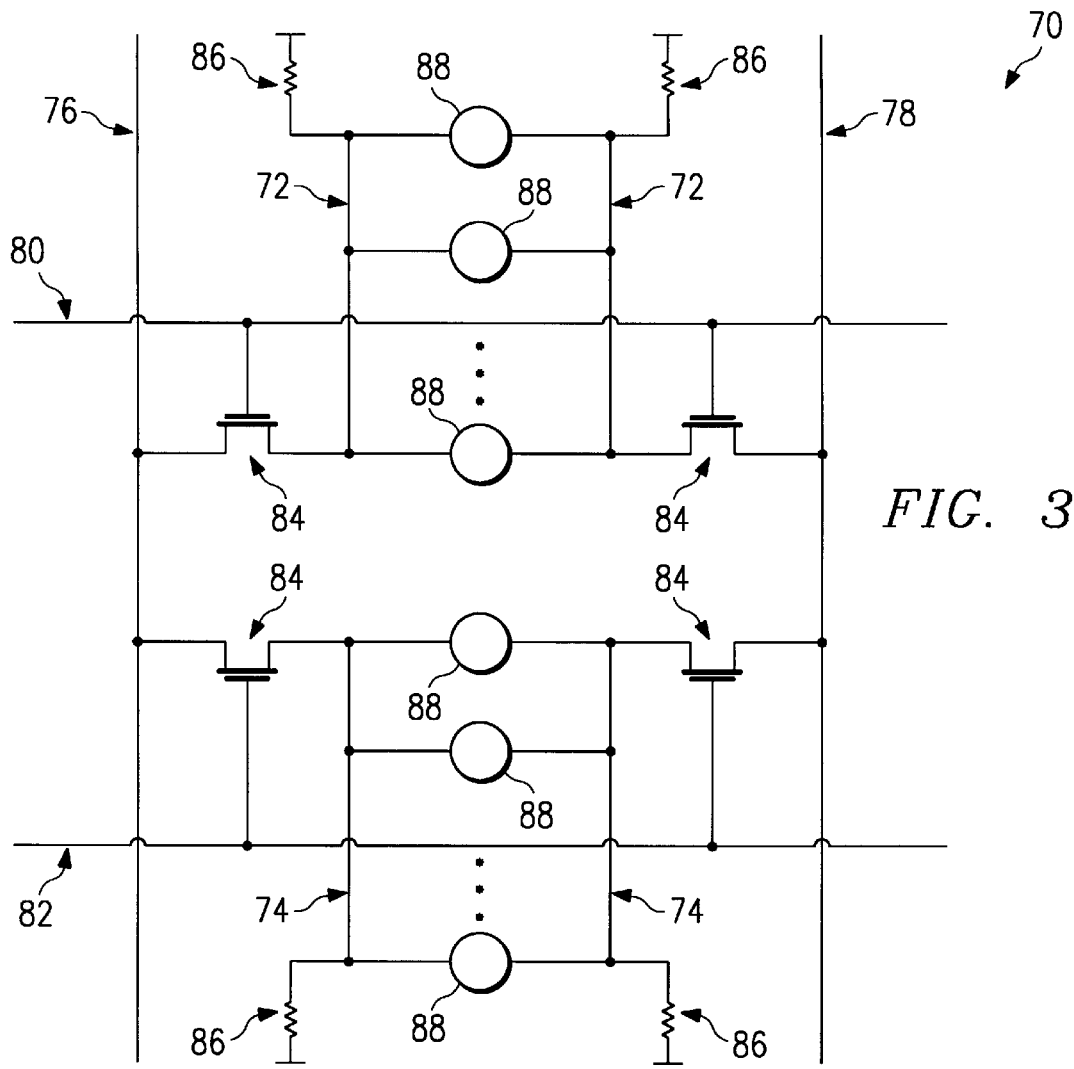
FIG. 3 is a schematic diagram of a partitioned memory array having interface circuitry and local bitline resistors, according to the present invention.

Referring now to FIG. 3., shown is a schematic diagram of a partitioned memory array 70 having interface circuitry 84 and local bitline high value resistors 86 such that local bitlines do not float. For simplicity, only two of the four local bitlines required for the 4 Megabit example are shown: local bitline pairs 72 and 74. Local bitline pairs 72 and 74 have high value resistors 86 which tie the local bitline pair to $V_{CC}$ such that it does not float. A typical value for high value resistor 86 is 1 Megohm. The local bitline pairs are connected to master bitline 76 and master bitline 78 by interface circuitry 84. Local select signals 80 and 82 couple local bitlines 72 and 74, respectively, to master bitline 76 and master bitline 78. The use of interface circuitry 84 and resistive load 86 greatly decreases the level of bitline capacitance which must be driven by memory cells 88 and ties the local bitlines to a predetermined voltage.

The recovery of local bitlines through precharge and/or equilibrate can be accomplished by leaving local select signals on while the master bitline pair is being recovered. If required, local bitline pairs could have their own equilibrate and/or precharge devices, such as a p-channel or other shorting transistor, where equilibrate is decoded based on local select signals. In addition, on a synchronous or pipelined device, multiple wordlines associated with different local bitlines could be selected at the same time, if advantageous. This would allow independent development of signals on each local bitline, where the clocking of local select signals are performed at the appropriate time. This would, of course, increase the power consumption level. However, if signal swing on the local bitlines is reduced, equilibrate and/or precharge may be avoided entirely, except at the end of a write cycle. Thus, circuitry needed for equilibrate and/or precharge functions would be reduced or eliminated.

Interface circuitry may be implemented a variety of ways but it must allow for the reading and writing of memory cells. Additionally, it is desirable to explore interface circuitry options which provide voltage gain and/or isolation while connecting local bitlines to master bitlines. FIGS. 4–17, schematic diagrams illustrating alternate preferred embodiments of interface circuitry necessary for performing a read, according to the present invention, are shown.

Figure 4:
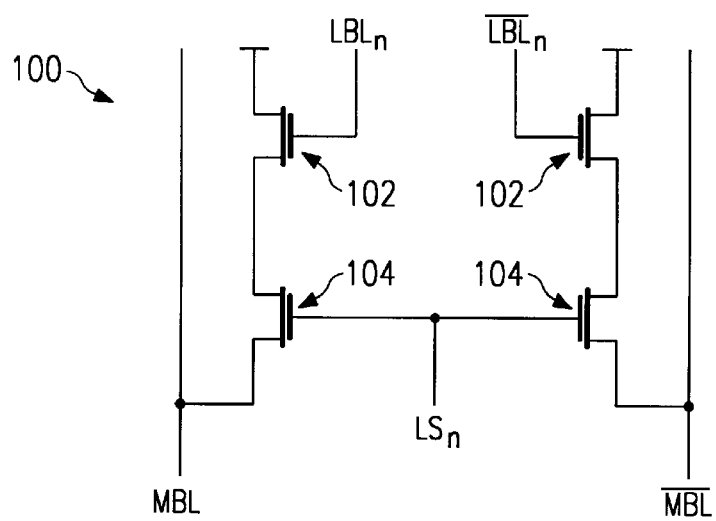

Referring now to FIG. 4, interface circuitry 100 is shown. Local bitline pair $LBL_n$ and $\overline{LBL_n}$ are connected to master bitline pair MBL and $\overline{MBL}$ via source follower transistors 102 and select transistors 104. While the select transistors 104 are shown as n-channel devices, they could also be p-channel transistors. The local select signal $LS_n$ is used to select one local bitline pair to control the master bitline pair. This option works particularly well when local bitlines are biased at $V_{CC}$. Source follower transistors 102 are advantageous in that they provide a shifting mechanism for MBL and $\overline{MBL}$ which allows an optimum common mode voltage for sensing MBL and $\overline{MBL}$ to be provided. Master bitline pair MBL and $\overline{MBL}$ are then sensed by a separate sense amplifier.

The gain provided by source follower transistors 102 may be close to unity, depending on the master bitline load used, but a high current drive or transconductance may be instead achieved, which is desirable when driving large capacitances. Unlike interface circuitry for a passive hierarchical bitline structure, interface circuitry for an active hierarchical bitline structure is comprised of active components which amplify the local bitline voltage or current differential developed by the selected memory cell. In addition, the local bitline capacitance is isolated from the master bitline capacitance. Thus, the local bitline capacitance is basically the only capacitance the memory cell must drive. Also, unlike the prior art where SRAMS typically have passgates in the column decode path, the local bitline signal does not go through passgates which can retard signal development.

Figure 5A:
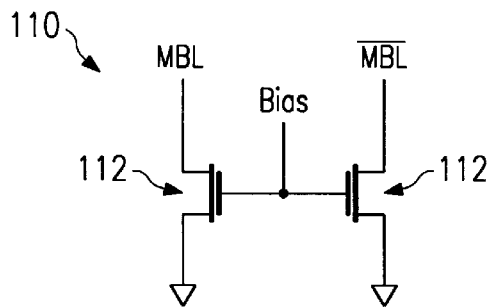

A variety of master bitline load devices exists for hierarchical bitline structures. FIGS. 5a–5d illustrate load devices which offer varying degrees of gain which may be achieved. These load devices may be controlled by a column decode signal. Referring to FIG. 5a, the master bitline pair has as load devices n-channel transistors 112. N-channel transistors 112 are controlled by the Bias signal and are biased at a DC voltage above a threshold voltage level. The Bias signal may be a column decode signal, such that only selected columns draw current. In this way, current and therefore power dissipation is greatly reduced. An additional advantage of load device 110 is that few transistors are used. For simplicity, column decode control circuitry is not shown.

Figure 5B:
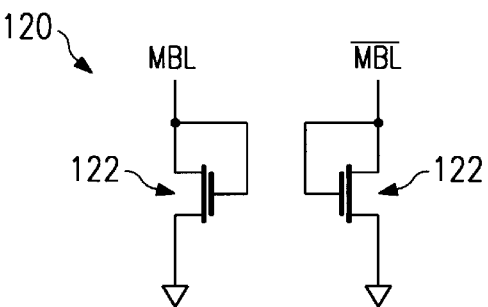
Figure 5C:
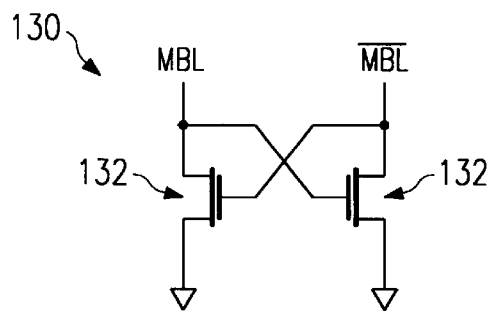
Figure 5D:
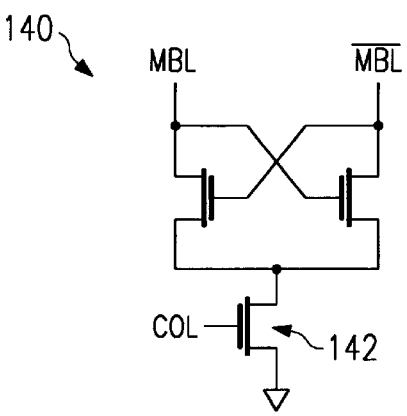

FIG. 5b illustrates n-channel load transistors 122, the gate of which is tied to the master bitline. Unlike the load device 110 of FIG. 5a, no biasing is provided and gain may be reduced. Referring to FIG. 5c, a third type of master bitline loading device 130 is shown. The gates of N-channel load transistors 132 are tied to the opposite master bitline as shown. This configuration offers greater gain than the load devices of FIGS. 5a and 5b, but does introduce feedback which may result in varying degrees of device latching. Referring to FIG. 5d, a similar load device 140 with column decode control is shown. MBL and $\overline{MBL}$ are tied to n-channel transistor 142 which has column decode signal COL has its gate input.

While the master bitline load devices of FIGS. 5a–5d are described in conjunction with the interface circuitry of FIG. 4, it will be understood by one skilled in the art that these load devices are equally well suited for other interface circuitry options, such as those which will now be described. An advantage of the load devices of FIGS. 5a–5d is that they have only a small number of transistors, effectively allowing for a smaller layout area.

Figure 6:
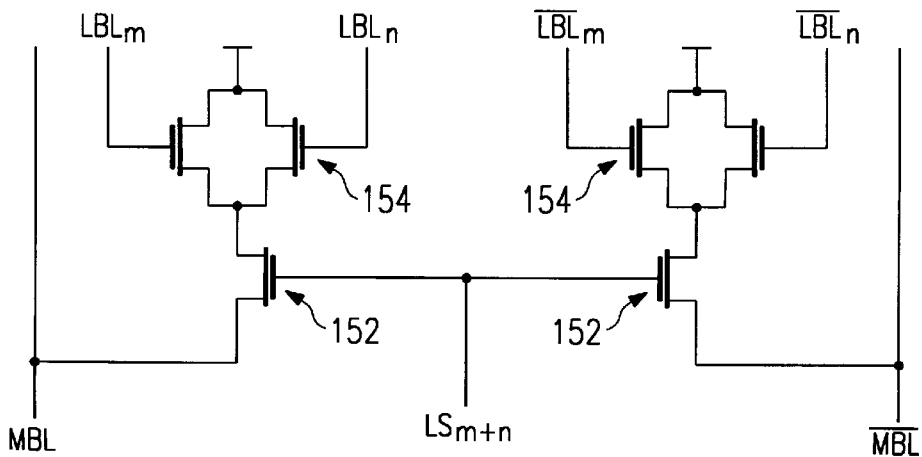

The circuitry 150 of FIG. 6 connects two different local bitlines $LBL_m$ and $LBL_n$ to master bitline pair MBL and $\overline{MBL}$ by combining interface circuitry. Adjacent interface circuitry, n-channel transistors 152, is utilized to minimize transistor count. Even though both local bitline $LBL_m$ and local bitline $LBL_n$ will affect master bitline pair MBL and $\overline{MBL}$ at the same time, only column m or n will have a voltage differential from the supply voltage, which is typically 5 volts. Therefore, the current differential of n-channel source follower transistors 154 is comparable to that of source-follower transistors 102 of FIG. 4. However, the current differential expressed as a percent of total source-follower current is half that of FIG. 4.

Interface circuitry 160 of FIG. 7 uses one less transistor than circuitry 100 of FIG. 4. Two select transistors have been replaced by n-channel select transistor 162, the gate of which is connected to local select signal $LS_n$. Select transistor 162 and source-follower transistors 164 are n-channel, but may also be p-channel transistors. Master bitline pair MBL and $\overline{MBL}$ may get clamped by unselected local bitline transistors, depending on the voltage of the master bitline pair.

FIG. 8 illustrates interface circuitry 170 in which only one local bitline will have a voltage differential from the supply voltage. This is similar to the voltage differential discussed in FIG. 6. Again, only one local bitline will have a voltage differential, and the total current differential on the master bitline pair caused by source follower transistors 172 is due to the resultant voltage differential when a memory cell is selected. The differential expressed as a percentage of total current may be reduced depending on the number of local bitline segments that exist. Thus, the percentage may be lower than that possible with the FIG. 6 option. Additionally, during write cycles, source follower transistors 172 must be weak enough to be initially overcome; in the other interface circuitry option previously discussed, it is permissible to have the transistors turned off during a write cycle. A advantage of interface circuitry 170 is the small number of transistors required.

A major advantage of the interface circuitry 180 of FIG. 9 is that local bitline pairs, such as $LBL_n$ and $\overline{LBL_n}$, which are not selected by local select signal $LS_n$ are not isolated from the master bitline pair MBL and $\overline{MBL}$ but instead form the loads for the master bitline pair. The drain of local bitline transistors 182 are clocked. A local bitline is selected when local select signal $LS_n$ high and is deselected when it is low.

Because local bitline transistors 182 act as master bitline loading devices when deselected, the load devices described in FIGS. 5a–5d are not necessary for interface circuitry 180. A disadvantage to this approach is that the current drawn through the loading devices is not controlled by column decoding or any other signal.

Referring to FIG. 10, another interface circuitry option 190 is shown. As in FIG. 6, interface circuitry is combined for two adjacent local bitline pair segments: $LBL_m$ and $LBL_n$. This approach results in fewer transistors being used than if the two adjacent local bitline pair segments did not share interface circuitry. Master bitline pair MBL and $\overline{MBL}$ has no series devices on source follower transistors 192, but the memory cell sees a pass gate. When selecting a local bitline, the appropriate local select signal goes to a logic low voltage level.

For the interface circuitry 200 shown in FIG. 11, it is necessary for the local bitline pair $LBL_n$ and $\overline{LBL_n}$ to be biased below $V_{CC}-|V_{Tp}|$, such as $V_{CC}-V_{Tn\text{-}body}$. The sources of local bitline p-channel transistors 202 are clocked such that the selected local bitline segment has local select signal $LS_n$ high and the deselected local bitline segment has local select signal $LS_n$ low. In other words, as long as the master bitline pair is biased below $V_{CC}-V_{Tn\text{-}body}+|V_{Tp\text{-}body}|$ and $V_{Tn\text{-}body}>|V_{Tp}|$, the unselected segments will be isolated from the master bitline pair. Also, as long as the master bitline pair is biased at or below $V_{CC}-[V_{Tn\text{-}body}-V_{Tp}]$, p-channel local bitline transistors 202 will be in saturation. For the above equations, $V_{CC}$ is the supply voltage, $V_{Tp\text{-}body}$ and $V_{Tn\text{-}body}$ are the body effect threshold voltages of p-channel and n-channel transistors, respectively.

Figure 11:
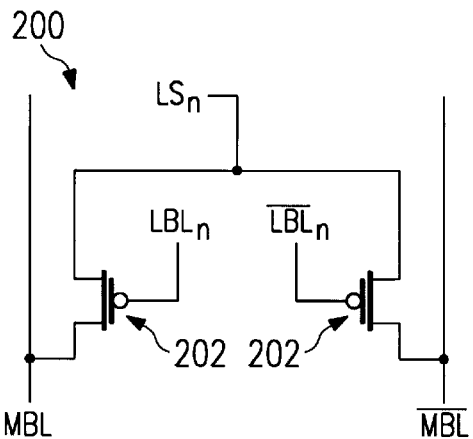

In FIG. 11, p-channel transistors and biasing of local bitlines at $V_{CC}-V_{Tn\text{-}body}$ are described and can be used with any other interface circuitry explored in FIGS. 2 through 10 above.

Figure 12:
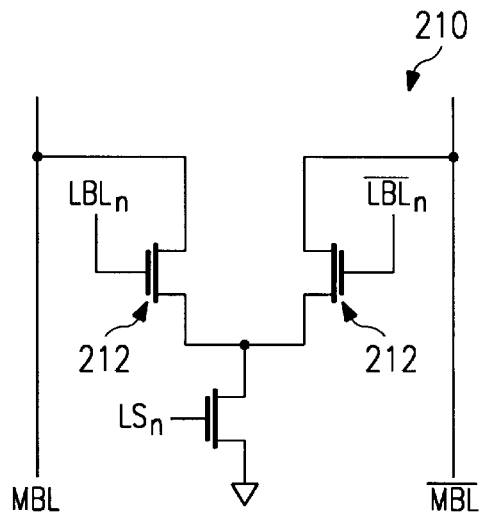

The interface circuitry described above has been biased at a supply voltage such as $V_{CC}$ or $V_{CC}-V_T$. It is also possible to have circuitry which is tied to ground. Referring to FIG. 12, interface circuitry 210 connects local bitline pair $LBL_n$ and $\overline{LBL_n}$ to master bitline pair MBL and $\overline{MBL}$ but is biased to ground as shown. Source coupled n-channel transistors 212 are used to interface local bitlines to the master bitline; local bitline pair $LBL_n$ and $\overline{LBL_n}$ is selected when $LS_n$ is a logic high voltage level. Local bitlines may be biased at $V_{CC}-V_{Tn}$ with the master bitline load devices, examples shown in FIG. 13, such as high value resistors or p-channel transistors, connected to $V_{CC}$.

Figure 13A:
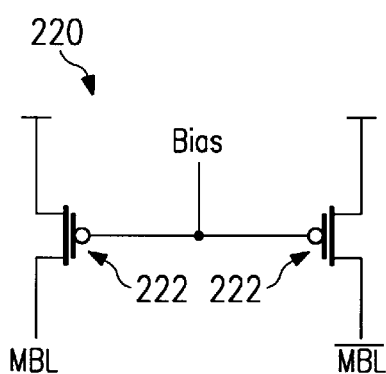

Referring to FIGS. 13a–13d, several different master bitline loading devices are shown. As in FIGS. 5a–5d, these load devices may easily be controlled by a column decode signal such that only selected columns would draw current, thereby reducing current and power consumption. Referring to FIG. 13a, the master bitline pair has as load devices p-channel transistors 222. P-channel transistors 222 are controlled by the Bias signal and are biased at a DC voltage below $V_{CC}-|V_{Tp}|$. The Bias signal may be a column decode signal, such that only selected columns draw current. The Bias signal is a logic high voltage level when the column is unselected. In this way, current and therefore power dissipation is greatly reduced. An additional advantage of load device 220 is that few transistors are used. For simplicity, column decode control circuitry is not shown.

Figure 13B:
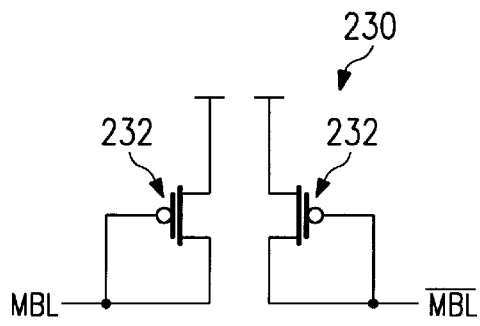
Figure 13C:
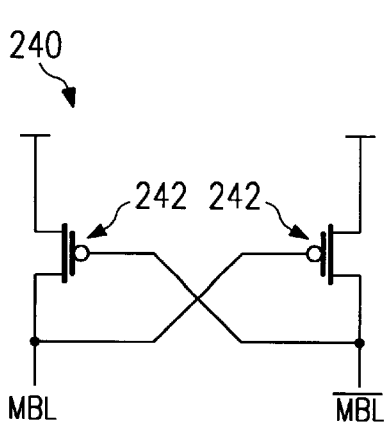
Figure 13D:
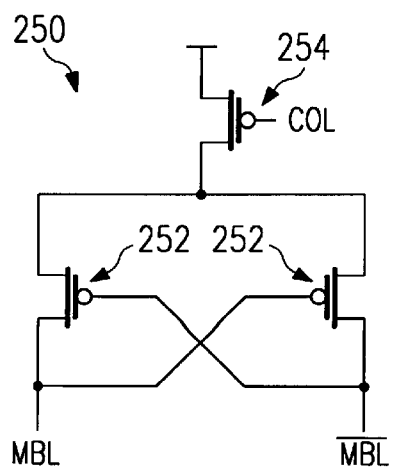

FIG. 13b illustrates p-channel load transistors 232, the gate of which is tied to the master bitline. Unlike the circuitry 220 of FIG. 13a, no biasing is provided and gain may be relatively small. Referring to FIG. 13c, a third type of master bitline loading device 240 is shown. The gates of p-channel load transistors 242 are tied to the opposite master bitline as shown. This configuration offers greater gain than the load devices of FIGS. 13a and 13b, but also introduces feedback which may result in varying degrees of device latching. Referring to FIG. 13d, a similar load device 250 with column decode control is shown. P-channel transistor 254 has column decode signal COL as its gate input. Resistors, biased to $V_{CC}$, could also be used as master bitline load devices.

While the master bitline load devices of FIGS. 13a–13d are described in conjunction with the interface circuitry of FIG. 12, it will be understood by one skilled in the art that these load devices are equally well suited for other interface circuitry options, such as those which will now be described.

Figure 14:
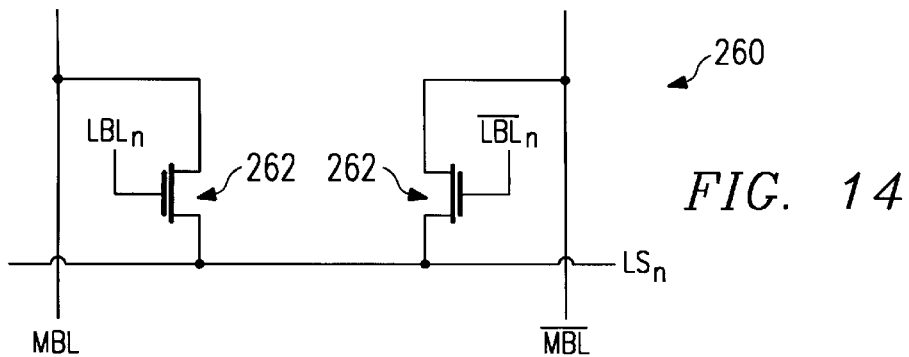

Referring to FIG. 14, the current source transistor used in other interface circuits is not included to minimize transistors used. Instead the local select signal $LS_n$, which is clocked to ground, acts as a current source. Local bitline pair $LBL_n$ and $\overline{LBL_n}$ are connected to local bitline transistors 262 which are connected to master bitline pair MBL and $\overline{MBL}$. An advantage of this interface circuitry is that the transistor count is low.

Figure 15:
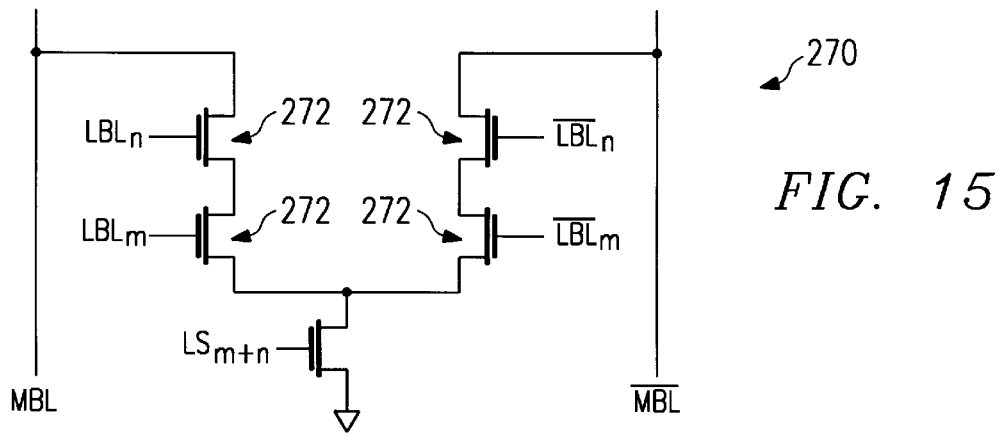

FIG. 15 illustrates interface circuitry 270 which is similar to that shown in FIG. 12 but that adjacent local bitline segments combine interface circuitry in order to save on transistor count. Interface circuitry 270 connects local bitline pairs $LBL_n$, $\overline{LBL_n}$, $LBL_m$, and $\overline{LBL_m}$ to master bitline pair MBL and $\overline{MBL}$ but is biased to ground as shown. N-channel transistors 272 are used to interface local bitlines to the master bitline. While transistors 272 are connected serially, they may also be placed in parallel to each other. Local bitlines may be biased at $V_{CC}-V_{Tn}$ with the master bitline loads such as high value resistors or p-channel transistors, connected to $V_{CC}$.

Local bitline segments which are not selected by local select signal $LS_{m+n}$ will have no differential voltage from ground, such that the differential voltage on the master bitline pair will be due to the differential which exists at the local bitline pair which is selected.

Figure 16:
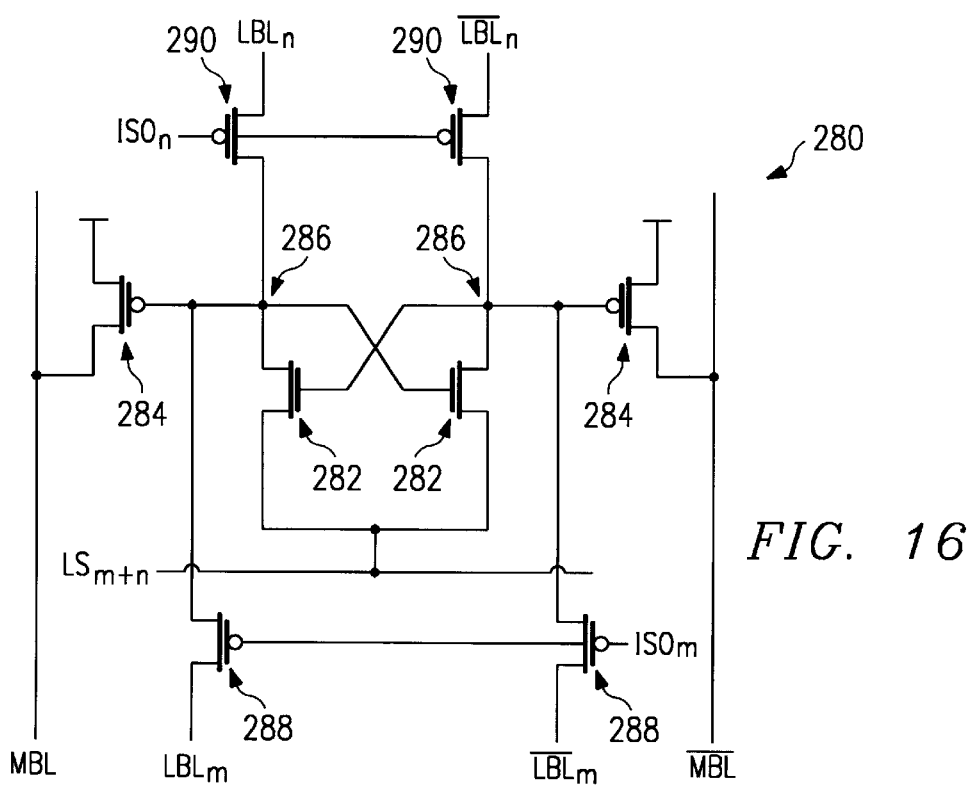

Referring to the interface circuit 280 of FIG. 16, adjacent local bitline segments $LBL_m$ and $LBL_n$ share a dynamic sense amp, comprised of n-channel transistors 282, clocked by local select signal $LS_{m+n}$. Again, the sharing of interface circuitry allows transistor count to be minimized. Also, having one local select signal $LS_{m+n}$ means less signals are needed. P-channel transistors 284 may be replaced by n-channel devices if sense nodes 286 are inverted.

Isolation input signals $ISO_m$ and $ISO_n$ allow local bitline $LBL_m$ or $LBL_n$ to be isolated. By setting $ISO_m$ to a logic high voltage level such as 5 volts, local bitline pair $LBL_m$ and $\overline{LBL_m}$ are effectively isolated from other device circuitry; similarly, when $ISO_n$ is set to a logic low voltage level such as 0 volts, local bitline pair $LBL_n$ and $\overline{LBL_n}$ are not isolated from the dynamic sense amplifier. For example, $LS_{m+n}$ is clocked low to sense data and $ISO_n$ is then clocked high to isolate the sense amplifier from local bitline $LBL_n$.

Figure 17:
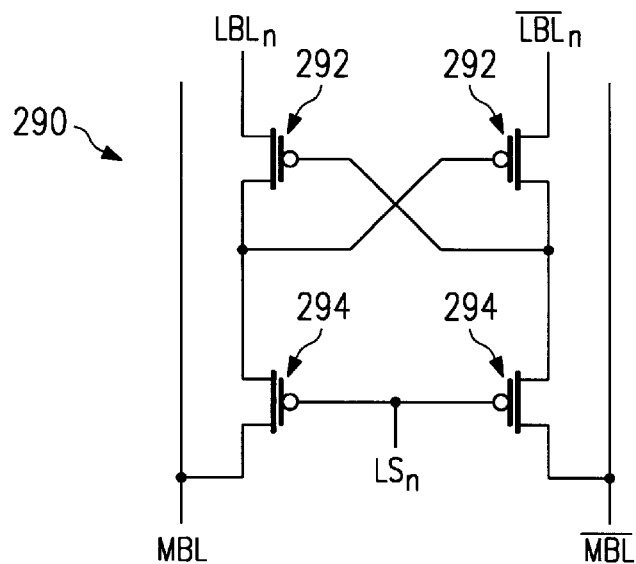

Finally, FIG. 17 illustrates interface circuitry 290 which employs a cascode current sense amp to provide a virtual short across local bitline pair $LBL_n$ and $\overline{LBL_n}$ if p-channel transistors 292 are biased properly, i.e. at saturation. Thus, the current difference between the series paths formed by p-channel transistors 292 and 294 is the memory cell current. As with other interface circuits, various load devices, such as those shown in FIGS. 5a–5d, may be utilized.

In addition to the interface circuitry discussed in FIG. 17, it is possible to use other forms of cascade and/or cascode voltage and current sensing to achieve voltage gain. Another option which may enhance manufacturability is to lay interface circuitry out on multiple column pitch with multiple local select signals decoded by column addresses.

Up to now, the interface circuitry options discussed have been suitable for performing a read, but have not provided connection between the master bitline pair and local bitline pairs suitable for performing a write. Referring to write circuitry 300 of FIG. 18, n-channel passgate 302 conducts only during a write cycle. Write local select signal $WLS_n$ will go to a logic high voltage level only during a write cycle and only if the row address points to a row associated with that particular local bitline, in this case $LBL_n$. A memory cell is written by driving the appropriate master bitline pair low and turning on the write local select n-channel transistors 302 such that the local bitline may be pulled to a low logic level.

As mentioned previously, recovery through precharging of the local bitlines may be achieved by precharing the master bitline pair and pulsing the write local select signal $WLS_n$ to connect the local bitline pair to its associated master bitline pair. Also, it may be necessary to have an equilibrate device on the local bitline pair in order to short together the two local bitlines comprising a bitline pair: for instance, $LBL_n$ and $\overline{LBL_n}$. If any equilibrate signal is required, it could be decoded using a local select signal.

Local bitlines which are not selected during a write cycle can not be allowed to float for an indefinite period of time. As mentioned earlier, a pull-up transistor or high value resistor may be required for each local bitline. For instance, an interface circuitry option calling for biasing of the local bitlines to $V_{CC}-V_T$ may utilize a high value resistor which is also connected to a $V_{CC}-V_T$ level. Alternately, if a pull-up transistor which is strong enough to clamp the local bitline voltage differential to a small value is used, recovery of the line through equilibration may not be required between read cycles even though recovery may be required after a write cycle.

Figure 18:
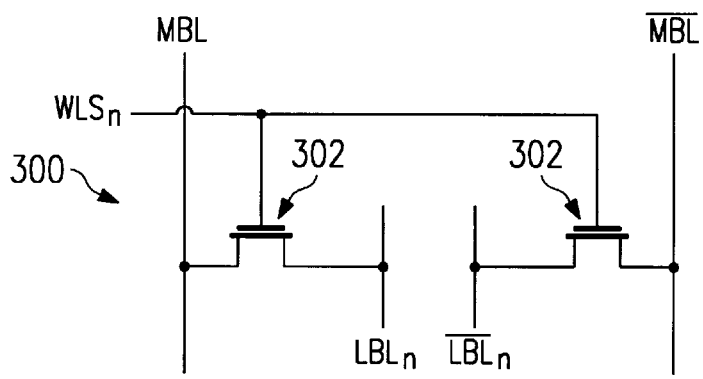
FIGS. 18–19 are schematic diagrams illustrating alternate preferred embodiments of interface circuitry necessary for performing a write, according to the present invention.
Figure 19:
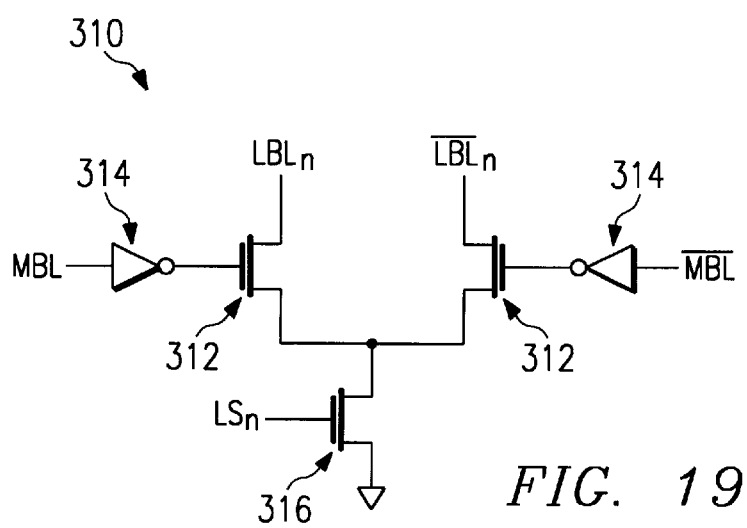

Another option for write circuitry is shown in FIG. 19. Local bitline transistors 312 control local bitline pair $LBL_n$ and $\overline{LBL_n}$. Circuitry 310 performs such that the master bitline pair is at or near $V_{CC}$ during a read cycle. However, during a write cycle, inverters 314 cause either LBL or $\overline{LBL}$ to be pulled to ground through local select transistor 316 based on either MBL or $\overline{MBL}$ being at ground. An advantage of this circuitry over that of FIG. 18 is that a separate write local select signal $WLS_n$ is not required.

The hierarchical bitline memory architecture described above is useful for asynchronous, synchronous and pipelined memory devices such as SRAMs, DRAMs, EPROMs and EEPROMs. It is particularly useful on high density, high performance devices such as the 4 Megabit SRAM, 16 Megabit SRAM and larger devices, to reduce the effective bitline capacitance a memory cell must drive. The speed advantage which could be realized with the hierarchical memory architecture would depend on the density of the device and the number of partitions of the bitline into local bitlines (at the expense of area) but could be on the order of several nanoseconds. The ability to choose various kinds of interface circuitry for use in hierarchical bitline memory architecture allows for the control of characteristics such as voltage gain and/or isolation. Control of these characteristics allows for an active hierarchical bitline memory architecture.

While the invention has been particularly shown and described with reference to a preferred embodiment, it will be understood by those skilled in the art that various changes in form and detail may be made therein without departing from the spirit and scope of the invention. For instance, local bitline pairs have been described in conjunction with the 4 Megabit SRAM embodiment, but one skilled in the art will appreciate that while other high density memories such as DRAMs, EPROMs, and EEPROMs have bitlines, not bitline pairs, the spirit and scope of the invention will not be affected. Additionally, the placement of the master bitlines in the third metal layer and local bitlines in the second metal layer is only one possible way to implement device metallization. Also, master and sub-master wordlines, master bitlines, and local bitlines could be placed in any conductive material such as metal or polysilicon.

What is claimed is:

1. A partitioned memory array, comprising:

a master bitline;

a plurality of serially connected local bitline segments of a local bitline connected to a plurality of memory cells and with each local bitline segment of the plurality of serially connected local bitline segments connected in parallel to the master bitline, wherein the plurality of memory cells are suitable for use during both a read operation and a write operation;

a plurality of interface circuits, wherein each interface circuit connects the master bitline to a local bitline segment of the plurality of serially connected local bitline segments, comprising one or more write interface circuits to connect the master bitline to the local bitline segment during the write operation and one or more read interface circuits to connect the master bitline to the local bitline segment during the read operation; and a plurality of local select signals, wherein a read local select signal of the plurality of local select signals is capable of selecting the local bitline segment to be coupled to the master bitline by a read interface circuit of the one or more read interface circuits during the read operation and wherein a write local select signal of the plurality of local select signals is capable of selecting the local bitline segment to be coupled to the master bitline by a write interface circuit of the one or more write interface circuits during the write operation.

2. The memory array of claim 1, wherein the local bitline is connected to the master bitline through at least one select transistor, and isolation of the capacitance of the local bitline from the capacitance of the master bitline is provided by at least one source-follower transistor, wherein the select transistor has a gate, a source, and a drain, and the source-follower transistor has a gate, a source, and a drain.

3. The memory array of claim 2, wherein the select transistor is an n-channel select transistor and the source-follower transistor is an n-channel source-follower transistor, and the source of the n-channel select transistor is connected to the master bitline, the gate of the n-channel select transistor is connected to the local select signal, and the drain of the n-channel select transistor is connected to the source of the n-channel source-follower transistor whose drain is connected to a supply voltage and whose gate is connected to the local bitline.

4. The memory array of claim 3, wherein at least a first local bitline and a second local bitline share the n-channel select transistor.

5. The memory array of claim 3, wherein the supply voltage is $V_{CC}$.

6. The memory array of claim 2, wherein the select transistor is a D-channel select transistor and the source-follower transistor is an n-channel source-follower transistor, and the drain of the p-channel select transistor is connected to the master bitline, the gate of the p-channel select transistor is connected to the local select signal, and the source of the p-channel select transistor is connected to the source of the n-channel source-follower transistor whose drain is connected to a supply voltage and whose gate is connected to the local bitline.

7. The memory array of claim 6, wherein at least a first local bitline and a second local bitline share the p-channel select transistor.

8. The memory array of claim 2, wherein the gate of the source-follower transistor is controlled by a pull-down transistor connected to ground and a pass gate which in turn is controlled by the local select signal, such that if the pass gate is not on, the source-follower transistor is turned off, and if the pass gate is on, the source-follower transistor is turned on.

9. The memory array of claim 8, wherein a first local bitline and a second local bitline share the source-follower transistor.

10. The memory array of claim 1, wherein a first local bitline and a second local bitline share the local select signal which provides a path to ground, with the first local bitline having a first interface circuit comprised of a first transistor and the second local bitline having a second interface circuit comprised of a second transistor.

11. The memory array of claim 10, wherein the first local bitline and the second local bitline form a local bitline pair.

12. The memory array of claim 10, wherein the first transistor and the second transistor may be connected to one another serially or in parallel.

13. The memory array of claim 1, wherein the local bitline is selected when the local select signal is set to a first voltage level and is not selected when the local select signal is set to a second voltage level.

14. The memory array of claim 13, wherein the first voltage level is a logic high and the second voltage level is a logic low.

15. The memory array of claim 1, wherein the signal on the local bitline is amplified through a source-follower transistor.

16. The memory array of claim 15, wherein the signal on the local bitline has a voltage level that is amplified.

17. The memory array of claim 15, wherein the signal on the local bitline has a current level that is amplified.

18. The memory array of claim 1, wherein the interface circuit amplifies a current differential of a selected memory cell.

19. The memory array of claim 18, wherein the current differential of the selected memory cell is amplified by a plurality of source-follower transistors.

20. The memory array of claim 19, wherein the current differential is on the master bitline and is caused by the plurality of source-follower transistors due to a resultant voltage differential on the local bitline when the selected memory cell is selected.

21. The memory array of claim 1, wherein a cascode current sense amp provides a virtual short across a local bitline pair, comprised of a first local bitline and a second local bitline, such that the first local bitline and the second local bitline operate at a same voltage potential.

22. The memory array of claim 21, wherein the first local bitline has a first p-channel transistor having a gate, a source, and a drain, and has a second p-channel transistor having a gate, a source, and a drain, and the second local bitline has a third p-channel transistor having a gate, a source, and a drain, and has a fourth p-channel transistor having a gate, a source, and a drain, wherein the gate of the first p-channel transistor is cross-coupled to the second local bitline, the drain of the first p-channel transistor is connected to the source of the second p-channel transistor whose gate is connected to the local select signal and whose drain is connected to the master bitline, and wherein the gate of the third p-channel transistor is cross-coupled to the first local bitline, the drain of the third p-channel transistor is connected to the source of the fourth p-channel transistor whose gate is connected to the local select signal and whose drain is connected to the master bitline.

23. The memory array of claim 1, wherein a local bitline which is not selected to be coupled to a corresponding master bitline is connected to an interface circuit which acts as a load device for the corresponding master bitline.

24. The memory array of claim 1, wherein local bitline capacitance is isolated from the master bitline capacitance by clocking a plurality of sources of a plurality select transistors with the local select signal.

25. The memory array of claim 24, wherein a p-channel select transistor has a gate, a source, a drain, and the source of the p-channel select transistor is clocked by the local select signal, the gate of the p-channel select transistor is connected to the local bitline, and the drain of the p-channel select transistor is connected to the master bitline.

26. The memory array of claim 1, wherein isolation between a local bitline and a master bitline is provided by a corresponding local select signal which is clocked to ground and acts as a current source when the local bitline is selected.

27. The memory array of claim 26, wherein a transistor has a gate, a source, and a drain, and the gate of the transistor is connected to the local bitline, the drain is connected to the master bitline and the source is connected to the local select signal.

28. The memory array of claim 1, wherein at least a first local bitline and a second local bitline share a dynamic sense amp, share a local select signal which clocks the dynamic sense amp, with the first local bitline having a first isolate signal to isolate the capacitance of the first local bitline from the capacitance of the master bitline, with the second local bitline having a second isolate signal to isolate the capacitance of the second local bitline from the capacitance of the master bitline, and wherein the dynamic sense amp controls a plurality of transistors connected to the master bitline.

29. The memory array of claim 28, wherein when the first isolate signal is a first predetermined voltage level, the first local bitline is isolated, and when the first isolate signal is a second predetermined voltage level, the first local bitline is not isolated; and when the second isolate signal is the first predetermined voltage level, the second local bitline is isolated, and when the second isolate signal is the second predetermined voltage level, the second local bitline is not isolated.

30. The memory array of claim 29, wherein the first predetermined voltage level is $V_{CC}$ and the second predetermined voltage level is 0 volts.

31. The memory array of claim 1, wherein the interface circuit by which the local bitline is connected to the master bitline has an n-channel pass gate.

32. The memory array of claim 31, wherein the n-channel pass gate is driven by a write local select signal such that the n-channel pass gate conducts only during a write cycle.

33. The memory array of claim 1, wherein, during a write cycle, an inverter connected to the master bitline causes the local bitline to be pulled to a predetermined voltage if the master bitline is at the predetermined voltage when the local bitline is selected.

34. The memory array of claim 1, wherein the local select signal controls the interface circuit for the master bitline.

35. The memory array of claim 1, wherein the local bitline is connected to a loading element such that it is tied to a predetermined voltage level.

36. The memory array of claim 35, wherein the loading element is a high value resistor.

37. The memory array of claim 36, wherein the high value resistor is formed in a polysilicon layer.

38. The memory array of claim 37, wherein the high value resistor is formed in an active diffusion region.

39. The memory array of claim 35, wherein the loading element is a pullup transistor.

40. The memory array of claim 1, wherein the memory array is formed using a first metal layer, a second metal layer, and a third metal layer.

41. The memory array of claim 40, wherein the plurality of master bitlines are formed on top of the plurality of local bitlines.

42. The memory array of claim 40, where the plurality of master bitlines are formed at an offset from the plurality of local bitlines.

43. The memory array of claim 1, wherein a metal layer which contains the plurality of master bitlines is above a metal layer which contains the plurality of local bitlines.

44. The memory array of claim 43, wherein the plurality of master bitlines reside in the third metal layer and the plurality of local bitlines reside in the second metal layer.

45. The memory array of claim 43, wherein the plurality of master bitlines reside in the second metal layer and the plurality of local bitlines reside in the first metal layer.

46. The memory array of claim 1, wherein the partitioned memory array is suitable for use in SRAM, DRAM, EPROM, and EEPROM memories.

47. The memory array of claim 36, wherein the memory array is a SRAM and the local bitline is a local bitline pair and the master bitline is a master bitline pair.

48. The memory array of claim 1, wherein the local bitline may be recovered when the local select signal is selected while the master bitline is being recovered.

49. The memory array of claim 1, wherein the local bitline has an equilibrate device which is controlled by an equilibration signal.

50. The memory array of claim 49, wherein the equilibration signal is decoded based on the local select signal.

51. The memory array of claim 1, wherein the local bitline has a precharge device which is controlled by a precharge signal.

52. The memory array of claim 51, wherein the precharge signal is decoded based on the local select signal.

53. The memory array of claim 1, wherein the master bitline has a load device which is connected to a supply voltage.

54. The memory array of claim 53, wherein the load device is controlled by a column decode signal.

55. The memory array of claim 54, wherein a bias signal controlled by the column decode signal controls the load device such that only a plurality of selected columns draw current.

56. The memory array of claim 54, wherein a master bitline pair has a first master bitline having a first transistor as its load device and a second master bitline having a second transistor as its load device, with the first transistor having a gate, a source, and a drain and the second transistor having a gate, a source, and a drain, wherein the gate of the first transistor is connected to the second master bitline and the gate of the second transistor is connected to the first master bitline.

57. The memory array of claim 56, wherein the first transistor and the second transistor are connected to a third transistor which is controlled by a column decode signal and connected to a supply voltage.

58. The memory array of claim 57, wherein the supply voltage is ground.

59. The memory array of claim 57, wherein the supply voltage is $V_{CC}$.

60. The memory array of claim 1, wherein each interface circuit provides for gain of a signal on the local bitline segment or isolation of the capacitance of the local bitline segment from the capacitance of the master bitline.

61. The memory array of claim 1, wherein during the write operation the master bitline is driven to a predetermined logic state and the write local select signal causes a write interface circuit of the one or more write interface circuits of the plurality of interface circuits to conduct, thereby driving the local bitline segment to the predetermined logic state.

* * * * *